United States Patent
Harrison et al.

(10) Patent No.: US 9,484,426 B2
(45) Date of Patent: Nov. 1, 2016

(54) METAL CONTACTS TO GROUP IV SEMICONDUCTORS BY INSERTING INTERFACIAL ATOMIC MONOLAYERS

(71) Applicant: Acorn Technologies, Inc., Santa Monica, CA (US)

(72) Inventors: Walter A. Harrison, Palo Alto, CA (US); Paul A. Clifton, Palo Alto, CA (US); Andreas Goebel, Palo Alto, CA (US); R. Stockton Gaines, Santa Monica, CA (US)

(73) Assignee: Acorn Technologies, Inc., La Jolla, CA (US)

( * ) Notice: Subject to any disclaimer, the term of this patent is extended or adjusted under 35 U.S.C. 154(b) by 0 days.

(21) Appl. No.: 15/043,035

(22) Filed: Feb. 12, 2016

(65) Prior Publication Data

US 2016/0163813 A1 Jun. 9, 2016

Related U.S. Application Data

(62) Division of application No. 14/360,473, filed as application No. PCT/US2012/060893 on Oct. 18, 2012, now Pat. No. 9,362,376.

(60) Provisional application No. 61/563,478, filed on Nov. 23, 2011.

(51) Int. Cl.
*H01L 29/47* (2006.01)
(52) U.S. Cl.
CPC ................................. *H01L 29/47* (2013.01)
(58) Field of Classification Search
CPC ................. H01L 21/28512; H01L 21/28518; H01L 29/456; H01L 21/283; H01L 29/045; H01L 29/47

USPC ................ 257/44, 155, 745, 761, 763, 750, 257/E33.003; 438/652, 655, 656
See application file for complete search history.

(56) References Cited

U.S. PATENT DOCUMENTS

| 4,843,029 A | 6/1989 | Joyce et al. |
| 6,344,673 B1 * | 2/2002 | Aussilhou ............... H01L 29/88 257/301 |

(Continued)

OTHER PUBLICATIONS

Acorn Technologies, Inc., International Application No. PCT/US2012/060893 filed Oct. 18, 2012, ISA/US, International Search Report and Written Opinion, Dec. 11, 2012, 23 pages.

(Continued)

*Primary Examiner* — Yasser A Abdelaziez
(74) *Attorney, Agent, or Firm* — Ascenda Law Group, PC

(57) ABSTRACT

Techniques for reducing the specific contact resistance of metal-semiconductor (group IV) junctions by interposing a monolayer of group V or group III atoms at the interface between the metal and the semiconductor, or interposing a bi-layer made of one monolayer of each, or interposing multiple such bi-layers. The resulting low specific resistance metal—group IV semiconductor junctions find application as a low resistance electrode in semiconductor devices including electronic devices (e.g., transistors, diodes, etc.) and optoelectronic devices (e.g., lasers, solar cells, photodetectors, etc.) and/or as a metal source and/or drain region (or a portion thereof) in a field effect transistor (FET). The monolayers of group III and group V atoms are predominantly ordered layers of atoms formed on the surface of the group IV semiconductor and chemically bonded to the surface atoms of the group IV semiconductor.

7 Claims, 8 Drawing Sheets

(56) References Cited

U.S. PATENT DOCUMENTS

| | | |
|---|---|---|
| 6,724,068 B2 | 4/2004 | Matsuyama |
| 6,724,088 B1 | 4/2004 | Jammy et al. |
| 7,084,423 B2 | 8/2006 | Grupp et al. |
| 7,176,483 B2 | 2/2007 | Grupp et al. |
| 7,462,860 B2 | 12/2008 | Grupp et al. |
| 7,884,003 B2 | 2/2011 | Grupp et al. |
| 8,110,877 B2 | 2/2012 | Mukherjee et al. |
| 8,952,541 B2 | 2/2015 | Mukherjee et al. |
| 2005/0104137 A1 | 5/2005 | Faulkner et al. |
| 2011/0092047 A1 | 4/2011 | Gaines et al. |
| 2011/0169124 A1 | 7/2011 | Grupp et al. |

OTHER PUBLICATIONS

"Patents Act 1977: Examination Report under Section 18(3)", UK Intellectual Property Office dated Apr. 29, 2015, Application No. GB1409999.8 (filed Oct. 18, 2012), 5 pgs.

McKinley; et al., "Control of Ge homojunction band offsets via ultrathin Ga-As dipole layers", Applied Surface Science (1992), 56-58(Part 2):762-765.

McKinley; et al., "Controlled modification of heterojunction band lineups by diffusive intralayers", Journal of Vacuum Science & Technology A Vacuum Surfaces and Films (May/Jun. 1990), 8(3):1917-21.

\* cited by examiner

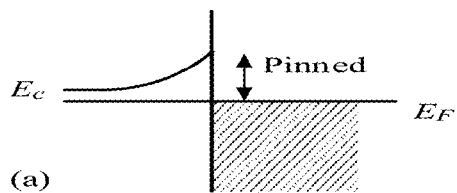
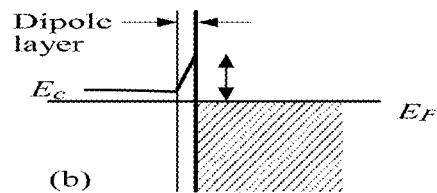
Figure 1(a)　　　　　　　　Figure 1(b)
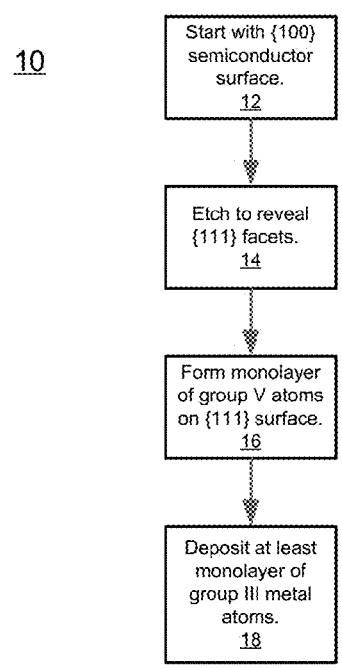
Figure 2

METAL CONTACTS TO GROUP IV SEMICONDUCTORS BY INSERTING INTERFACIAL ATOMIC MONOLAYERS

RELATED APPLICATIONS

The present application is a Divisional of U.S. patent application Ser. No. 14/360,473, filed 23 May 2014, which is a National Stage under 35 U.S.C. 371 of and claims priority to International Application No. PCT/US2012/060893, filed 18 Oct. 2012, which claims priority to and incorporates by reference U.S. Provisional Application No. 61/563,478, filed 23 Nov. 2011.

FIELD OF THE INVENTION

The present invention relates to techniques for reducing the specific contact resistance of metal-semiconductor (e.g., group IV semiconductor) junctions by interposing a monolayer of group V or group III atoms at the interface between the metal and the semiconductor, or interposing a bi-layer made of one monolayer of each of group V and group III atoms, or interposing multiple such bi-layers.

BACKGROUND

As the size of transistors is reduced to nanometer scale dimensions, for example in the form of ultra-thin body (UTB) silicon-on-insulator (SOI) field effect transistors (FETs), FinFETs and nanowire FETs, the unwanted resistance associated with transistor sources and drains becomes an ever increasing burden on the performance of these devices and of the integrated circuit products manufactured using such transistors. Furthermore, a reduction of dopant activation is predicted theoretically and demonstrated experimentally when the transistor source and drain regions are reduced in size below approximately 10 nm. By dopant activation, we mean desired free carrier (electron or hole) contributions from deliberately introduced impurity species in a semiconductor host. This decrease in nanoscale dopant activation further contributes to undesirably high resistance of doped source/drain (S/D) regions both at the nanoscale metal contacts and within the bulk portion of the nanoscale doped regions. The resistance of metal contacts to a semiconductor increases if effective doping in the semiconductor decreases, the increase being primarily due to the presence of a Schottky barrier at metal-semiconductor contacts.

It is known that a high concentration of doping in a shallow region of semiconductor proximate to a metal-semiconductor interface can reduce the resistance of the metal-semiconductor contact by decreasing the width of the Schottky barrier. Although it is the barrier width that is reduced, from an electrical response point of view (for example current—voltage measurement), it appears that the Schottky barrier height is reduced. An early article that describes this "effective barrier height" reduction by surface doping is by J. M. Shannon, "Control of Schottky barrier height using highly doped surface layers" in Solid-State Electronics, Vol. 19, pp. 537-543 (1976). It is also known that a high concentration of dopant atoms can be introduced into a shallow region of a semiconductor proximate to a metal contact by so-called dopant segregation out of a metal silicide. A. Kikuchi and S. Sugaki reported in J. Appl. Phys., Vol. 53, No. 5, (May 1982) that implanted phosphorus atoms piled up near a PtSi—Si interface during PtSi formation and reduced the measured height of the Schottky barrier to n-type silicon. The reduction of the measured (effective) barrier height of the Schottky diode was attributed to piled up phosphorus atoms in the silicon causing the barrier to be more abrupt. That is, the result was attributed to the effect described by Shannon in 1976.

For the past several decades the silicon microelectronics industry has relied on high doping concentrations in the silicon proximate metal-silicon contacts as a means of obtaining acceptably low contact resistances to transistor sources and drains. The contact metal has for the most part been a metal silicide, most recently nickel silicide or nickel platinum silicide. This approach to minimizing contact resistance is expected to be insufficient in the future as the transistor dimensions continue to shrink and the contact resistance becomes a larger portion of the total resistance between the source and drain (hence becoming a serious performance-limiting factor). The most recent International Technology Roadmap for Semiconductors (ITRS), published in 2011, reports that there is no known solution to the contact resistance problem in bulk MOS transistors when the transistor gate length scales to 18 nm, as expected in year 2014, and a specific contact resistance of no more than $1.0 \times 10^{-8}$ Ohm·cm$^2$ is specified. It is becoming increasingly apparent that the Schottky barrier at metal-semiconductor contacts must be reduced in order to reduce the contact resistance to acceptable levels, i.e. well below $1.0 \times 10^{-8}$ Ohm·cm$^2$ in the case of MOS transistor doped source/drain contacts. A technology that is capable of reducing the Schottky barrier and hence reducing the resistance of contacts to doped semiconductor regions may also be applied to so-called "metal source/drain transistors" which do not have doped source and drain but rather utilize a direct contact between the metal and the transistor channel (the region of free carriers that are modulated by the electrical potential on a gate and that transport current between the source and the drain).

A body of work published in 1991-1992 reported experimental verification of theoretical predictions by Baroni, Resta, Baldereschi and others that a double intralayer formed by two different elements would create an interface dipole, capable not only of modifying heterojunction band discontinuities, but also of generating band discontinuities in homojunctions. McKinley et al. first reported obtaining 035-0.45 eV band offsets at {111}-oriented Ge homojunctions using Ga—As dipole intralayers in a 1991 article "Control of Ge homojunction band offsets via ultrathin Ga—As dipole layers", J. Vac. Sci. Technol. A 9 (3), May/June 1991 and in a similar article in 1992 "Control of Ge homojunction band offsets via ultrathin Ga—As dipole layers", Applied Surface Science Vol. 56-58, pp. 762-765 (1992).

Arsenic, gallium, and germanium depositions were done at room temperature on p-type Ge(111) substrates. Valence band offsets were measured by in situ core level x-ray photoluminescence. The deposited Ge region (overlayer) had a valence band offset to the Ge substrate as manifested by a splitting of the Ge 3d core level into two components; one due to the Ge substrate and the other to the Ge overlayer. Both positive and negative valence band offsets were obtained in Ge homojunctions by introducing Ga—As dipole intralayers with either "Ga-first" or "As-first" growth sequences. The band offset was found to be 0.35-0.45 eV with the Ge valence band edge on the As side of the junction at a lower energy (i.e., more bound). Dipole intralayers were explained on the basis of the Harrison "theoretical alchemy" model described by W. A. Harrison et al. in "*Polar Heterojunction Interfaces*", Phys. Rev. B 18, 4402 (1978). Intralayer control of band discontinuities was thus applied to homojunctions, expanding the potential domain of band offset engineering beyond semiconductor heterojunctions.

In 1992, Marsi et al. followed up on the reports by McKinley et al. with the articles "Microscopic manipulation of homojunction band lineups", J. Appl. Phys., Vol. 71, No. 4, 15 Feb. 1992, "Homojunction band discontinuities induced by dipolar intralayers: Al—As in Ge", J. Vac. Sci. Technol. A 10(4), July/August 1992 and "Local nature of artificial homojunction band discontinuities", J. Appl. Phys. 72 (4), 15 Aug. 1992. In the first article, Marsi et al. reported valence-band discontinuities at Si—Si and Ge—Ge homojunctions when III-V double intralayers of atomic thickness were inserted at the interfaces. Valence band discontinuities were again measured by in situ core level x-ray photoluminescence. In Ge samples, a deposited Ge region (overlayer) had a valence band offset to a Ge substrate as evidenced by a splitting of the Ge 3d core level into two components and a deposited Si region had a valence band offset to a Si substrate as evidenced by a splitting of the Si 2p core level. The observed discontinuities with magnitudes in the range 0.4 to 0.5 eV (for example 0.5 eV for Si—P—Ga—Si and 0.4 eV for Si—P—Al—Si) were in qualitative agreement with theoretical predictions although most theories estimate larger valence band discontinuities due to the dipole effect. A III-V intralayer at a group-IV homojunction systematically induced an artificial valence-band discontinuity when the anion was deposited first. It was also reported that in the case of Si—Si homojunctions with Al—P or Ga—P intralayers, a reversal of the interface deposition sequence led to a reversal of the valence-band discontinuity, as expected.

In the second article it was shown, again using x-ray photoemission, that a similar band offset effect can be induced using Al—As as a "dipolar intralayer" between two regions of {111}-oriented germanium. Specifically, an offset of 0.4 eV was obtained for the "anion-first" Ge(substrate)-As—Al—Ge(overlayer) sequence, consistent with the "anion-first" As—Ga sequence reported by McKinley, the overlayer component exhibiting a lower binding energy with respect to the substrate component. In the third article, multiple III-V bilayer (intralayer) stacks were investigated. The measured value of valence band offset remained the same, 0.5 eV, for an individual double layer, for double-stacked bilayers and for triple-stacked bilayers. Experiments performed on 2(Ga—P) and 2(P—Ga) were fully consistent with those on 2(Al—P) and 2(P—Al); no substantial increase was observed on going from the individual bilayers to two bilayers or even to three bilayers. It was therefore concluded that stacked interfacial III-V bilayers do not increase the effect of an individual bilayer, contrary to elementary predictions based on sequential dipoles.

In U.S. Pat. Nos. 7,084,423, 7,176,483, 7,462,860, and 7,884,003 and in pending U.S. patent application 2011/0169124, Grupp and Connelly described metal-semiconductor contacts having an interfacial layer at the interface between a metal and a group IV semiconductor for the purpose of reducing the Schottky barrier at the contact and, hence, reducing the specific resistivity of the contact. A monolayer of arsenic (or nitrogen) was included amongst the possible embodiments/specifications of the interfacial layer.

SUMMARY OF THE INVENTION

It is a distinct feature of the present invention that deliberately introduced group V or group III atoms (or group II or group VI atoms) are organized in single ordered (e.g., epitaxially oriented) interfacial monolayers. Moreover the present invention provides a process and structure wherein a metal contact is deposited and not necessarily formed by silicidation, a feature that allows a much broader range of metals to be used for formation of metal-semiconductor contacts, particularly metals that have favorable properties over metal silicides for specific applications such as higher electrical conductance or optical transparency or ferromagnetism. The highest possible metal conductivity is desired in metal source/drain field effect transistors as these devices are scaled down in size to have critical dimensions (for example source width and height) of 20 nanometers or less. Efficient spin injection into semiconductors from ferromagnetic metals such as gadolinium is required for devices such as spin effect transistors in so-called spin-electronics ("spintronics") applications. A spin-metal-oxide-semiconductor field effect transistor (spin-MOSFET) with ferromagnetic metal source and drain and a group IV semiconductor channel is an example of a spin effect transistor. In emissive displays it is often desirable to have a metal contact that allows good transmission of emitted light (high transparency) yet at the same time forms a low resistance contact to the active material. Conversely in photonic devices such as semiconductor lasers or modulators, it may be desirable to have metal contacts that are not transparent so as to minimize losses due to light absorption. Metal silicides have the undesirable property of being somewhat transparent, with the consequence that optical energy may enter a silicide region located within the optical field of a photonic element and subsequently be absorbed in the silicide.

The present invention does not require doping of the semiconductor proximate to the metal contact, although it may be practiced in conjunction with semiconductor doping. Nor does the present invention require a metal silicidation step. Devices configured in accordance with embodiments of the present invention include at least an ordered monolayer of a group V and/or an ordered monolayer of a group III element or elements at the interface between a semiconductor and a metal contact. The metal is deposited after the formation of at least an ordered monolayer of interfacial atoms.

Embodiments of the present invention provide electrical contacts having one or more monolayers disposed between a group IV semiconductor and a metal, the semiconductor characterized by a crystal lattice structure and a monolayer consisting of a single atomic layer of atoms of one or more group V materials or a single atomic layer of atoms of one or more group III materials, each single atomic layer being in epitaxial alignment with one another and with the semiconductor lattice; and methods of forming such electrical contacts.

Further embodiments of the invention provide an electrical contact that includes a metal and a group IV semiconductor separated by a monolayer of group V atoms and, optionally, a monolayer of group III atoms at an interface between the metal and the semiconductor. The metal may be made of atoms of the same metallic element as the monolayer of group III metal atoms or of atoms of a different metallic element than the monolayer of group III metal atoms. In some instances, the group III atoms may be any one or more of aluminum, gallium, indium or boron, or mixtures of aluminum, gallium, boron and/or indium. The group IV semiconductor may be germanium, silicon, an alloy of germanium and silicon or germanium and tin, or an alloy or compound of silicon and/or germanium with carbon. The group V atoms may be any one or more of nitrogen, phosphorus, arsenic or antimony. In some instances, one monolayer of group III atoms will be immediately adjacent the surface of the group IV semiconductor. In other cases, one monolayer of group V atoms will be immediately adjacent the surface of the group IV semiconductor. The surface of the group IV semiconductor may be a {111}-oriented surface or a {100}-oriented surface.

The present invention also includes methods of forming electrical contacts such as those described above. In some instances, this involves a {100}-oriented surface of the group IV semiconductor being etched with a crystallographically selective etch to reveal and expose one or more {111}-oriented semiconductor crystal facets; the monolayer of group V atoms being formed on the {111} facets; and the monolayer of group III atoms being subsequently deposited on the monolayer of group V atoms. The monolayers of group V atoms and/or group III atoms may be produced by way of separate vapor deposition processes or by separate chemical reactions. For example, in a process conducted under ultra-high vacuum (UHV) conditions, prior to depositing the group V atoms or the group III atoms, as appropriate, the {111}-oriented facets of the semiconductor may be cleaned in situ and the semiconductor heated to a sufficiently high temperature to obtain a 7×7 reconstruction in the case of a {111} silicon surface or a 5×5 reconstruction in the case of a {111} silicon germanium surface or a 2×8 reconstruction of a {111} germanium surface after which the semiconductor may be heated to an elevated temperature during deposition of the group V atoms and/or group III atoms. After forming a first monolayer of group V atoms and a first monolayer of group III metal atoms, metal atoms may be deposited on the first bi-layer (two monolayers) directly or further monolayers of group V atoms and/or group III atoms may be added to create a stack of monolayers in excess of a single bi-layer before metal atoms are deposited to form a contact.

These and further embodiments of the present invention are described in greater detail below.

BRIEF DESCRIPTION OF THE DRAWINGS

The present invention is illustrated by way of example, and not limitation, in the figures of the accompanying drawings, in which:

FIGS. 1(a) and 1(b) illustrate potential barriers at metal-semiconductor junctions; specifically FIG. 1(a) shows a semiconductor (to the left)—metal (to the right) interface with a fixed and thick barrier to electron flow; and FIG. 1(b) illustrates how a dipole layer interposed between the metal and semiconductor has eliminated the barrier except between one pair of atomic planes.

FIG. 2 illustrates an example of a process for forming a very low resistance metal contact to a semiconductor surface in accordance with an embodiment of the present invention.

DETAILED DESCRIPTION

Figure 3A:
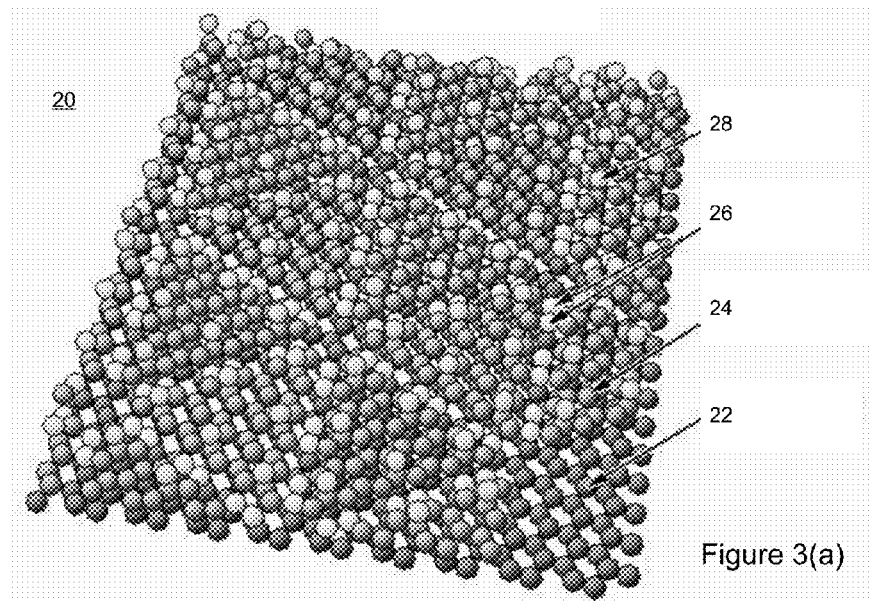
FIGS. 3(a), 3(b) and 3(c) provide views of a 7×7 reconstructed {111}-oriented silicon surface.
Figure 3B:
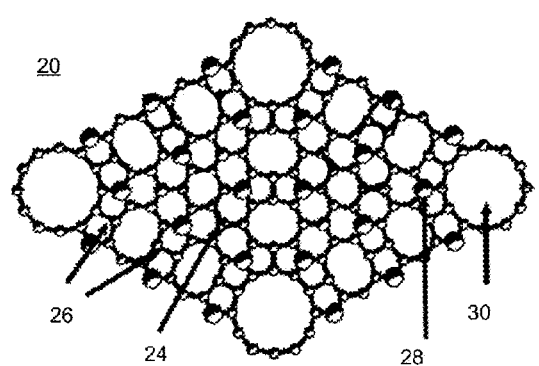
Figure 3C:
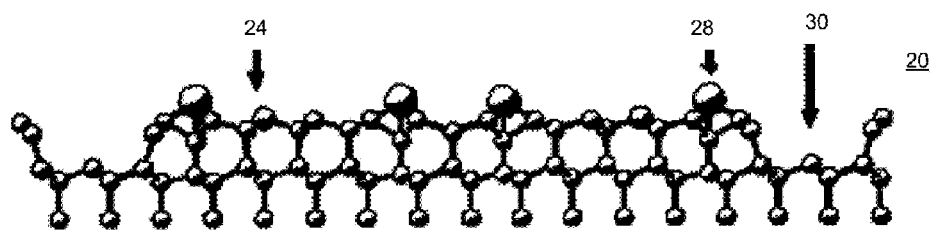

In light of the challenges described above, the present inventors have recognized a need for a metal contact technology that can reduce the resistance of metal contacts to doped S/D regions or, alternatively, a metal-semiconductor technology that eliminates, as much as possible, the Schottky barrier between the metal and the semiconductor. A low resistance metal-semiconductor contacting technology will have application wherever low resistance is required, for example in solar cell applications and in metal S/D field effect transistors (FETs). The present invention relates to techniques for reducing the specific contact resistance of metal-semiconductor (group IV) junctions by interposing a monolayer of group V or group III atoms at the interface between the metal and the semiconductor, or interposing a bi-layer made of one monolayer of group V atoms and one monolayer of group III atoms, or interposing multiple such bi-layers. The invention includes methods for forming such a metal-semiconductor contact of very low barrier height (approaching zero) and extremely low specific contact resistance by providing at least a single ordered layer of atoms at the interface between a metal and a semiconductor. The resulting low specific resistance metal—group IV semiconductor junction finds application as a low resistance electrode in semiconductor devices including electronic devices (e.g., transistors, diodes, etc.) and optoelectronic devices (e.g., lasers, solar cells, photodetectors, etc.) and/or as a metal source and/or drain region (or a portion thereof) in a FET. The monolayer of group V or group III atoms adjacent to the semiconductor surface is predominantly an ordered layer of atoms formed on the surface of the group IV semiconductor and chemically bonded to the surface atoms of the group IV semiconductor.

The present invention's emphasis on ordered monolayers, as well as the inclusion of group V elements, such as phosphorus or antimony, and group III elements, such as aluminum, boron, gallium or indium, distinguishes it from the earlier work of Grupp and Connelly (cited above). Further, the above-cited works of Marsi et al. and McKinley et al. specified an intention to create an energy band offset between two regions of semiconductor and no mention was made of modifying a Schottky barrier between a metal and a semiconductor or even of the possibility of doing so.

As described below, where both the group III and group V atoms are present, the resulting bi-layer provides an electrical dipole between the semiconductor and the bulk metal. A similar dipole exists when only a single layer of group V atoms is present, as an image charge is formed in the bulk metal. Further, in some instances, multiple bi-layers may be used between the semiconductor and the bulk metal (e.g., 2 or 3 such bi-layers). Indeed, dipole layers can be added until the extra energy from increasing the field causes the atoms to rearrange themselves.

Further, although monolayers of pure group V or group III substances are described herein, some embodiments of the present invention may make use of monolayers that comprise atoms of more than one type of group V atoms (for example a mixture of arsenic and phosphorus atoms within a monolayer) or more than one species of group III atoms. Hence, references to monolayers (whether part of a bi-layer or otherwise) both below and in the claims should be read as encompassing monolayers of a single kind of group V or group III atoms and as monolayers of group V or group III atoms of more than one element.

In the examples described herein, the semiconductor is a group IV semiconductor, for example germanium, silicon, an alloy of silicon and germanium, or an alloy comprising two or more of the elements silicon, germanium, carbon and tin. FETs or other electronic devices made up of compound semiconductors may also benefit from use of low resistance junctions provided in accordance with the present invention. Also in the following examples, the metal forming the junction with the semiconductor (and the interfacial layer of ordered group V atoms) is described as a group III metal. However, this need not necessarily be the case. It is not necessary that the metal is a group III metal. Other metals, e.g., low work function metals such as magnesium, lanthanum, ytterbium or gadolinium, may also be used for obtaining low electron potential (energy) barriers or high hole potential barriers between the metal and the semiconductor. Alternatively high work function metals such as nickel, platinum, iridium or ruthenium may be preferred for obtaining low hole barriers or high electron barriers between the metal and the semiconductor. However this does not preclude the use of higher work function metals such as platinum or ruthenium for making contacts with low electron barriers either. The energy barrier between the metal Fermi level and the semiconductor conduction band can be low despite the metal having a high work function by virtue of the large magnitude of the dipole created by the presence of the ordered group V monolayer at the semiconductor interface.

It may be advantageous in many applications to use the same metal for making contact to both p-type and n-type doped semiconductor regions, for example in forming source and drain contacts in both p-channel FETs and n-channel FETs. Moreover, it may be very advantageous for the metal to be a barrier metal such as tantalum nitride (TaN) or titanium nitride (TiN) or ruthenium (Ru) and for the same barrier metal to be used in making contact to both p-type and n-type semiconductor regions. In such cases where the same metal is used to form low barrier contacts to both n-type and p-type semiconductor, the interfacial monolayer chemically bonded to the semiconductor surface will be an interfacial layer of ordered group V atoms at n-type contacts and will be an interfacial layer of ordered group III atoms at p-type contacts. Similarly, where the same metal is used to form metal sources and/or drains of both n-channel and p-channel metal source/drain MOSFETs, the interfacial monolayer chemically bonded to the semiconductor surface will be an interfacial layer of ordered group V atoms at source/drain junctions of n-channel MOSFETs and will be an interfacial layer of ordered group III atoms at source/drain junctions of p-channel MOSFETs.

Ferromagnetic metals such as gadolinium, iron, nickel or cobalt or alloys of these elements or ferromagnetic alloys of manganese may be used to obtain metal-semiconductor contacts with high spin injection efficiency. In specific applications where high electron spin injection efficiency is desired, the interfacial monolayer chemically bonded to the semiconductor surface is preferably an interfacial layer of ordered group V atoms. The ferromagnetic metal may be deposited directly on to the group V monolayer or a monatomic layer of group III metal atoms may be chemically bonded to the group V atoms and the ferromagnetic metal deposited on to the group III monolayer.

Also other metallic materials including alloys of pure metals, metal silicides such as nickel silicide of composition $Ni_2Si$, $NiSi$ or $NiSi_2$ or platinum silicide or cobalt silicide, or even semi-metals may be used wherein the metallic material is directly adjacent to the group V or group III monolayer. It is possible and may be most convenient in manufacturing for the same metallic material to be applied to both n-type and p-type semiconductor contacts or as the metal source and/or drain of both n-channel and p-channel MOSFETs.

To obtain the desired metal-semiconductor contact with extremely low barrier height to electrons and an extremely low resistance to the electrical conduction of electrons through the contact, the single ordered layer of atoms is a single ordered layer of group V atoms. The group V atoms may be nitrogen atoms, phosphorus atoms, arsenic atoms or antimony atoms or a mixture of these group V atoms. In one embodiment of the invention, the monolayer of group V atoms is a layer of arsenic atoms ordered in epitaxial (or substantially epitaxial) alignment with the germanium or silicon or group IV semiconductor alloy crystal lattice. Such a contact with extremely low resistance to conduction of electrons is used for making electrical contact to n-type doped semiconductor such as the n-type doped source and drain regions of an n-channel FET or for making metal source/drain regions that make direct contact to an electron channel in an n-channel FET.

In many cases, the surface of the group IV semiconductor on which the metal contact is formed will be a {111}-oriented surface and, to the greatest possible extent, each of the group V atoms in the single ordered layer of atoms is chemically bonded in a three-way coordination with atoms in the {111} oriented surface of the semiconductor. In other instances, however, the contacted surface of the group IV semiconductor will be a {100} or {110} surface. In some instances a {100} surface may be preferred.

Before discussing embodiments of the present invention in detail, it is helpful to review some of the underlying theory. At interfaces of contacts between metals and semiconductors, the Fermi energy in the metal is observed to be "pinned" at a specific energy in the semiconductor energy band gap for each semiconductor causing a barrier between the metal Fermi level and the conduction band or valence band in the semiconductor. Though the semiconductor can be made conducting (e.g., with doping), fixing the Fermi energy $E_F$ near the semiconductor band edge $E_c$ in the bulk crystal ($E_F$, without a voltage applied, is uniform through the system), as illustrated in FIG. 1(a), $E_c$ remains well above $E_F$ at the interface. As a consequence, the region of the semiconductor near the interface has not been made a good conductor. Current is carried only weakly between the metal and the strongly conducting region of the semiconductor. The conduction of electron current would be by thermionic emission into the conduction band (excitation over the barrier), or by tunneling through the barrier, which will often be even smaller as the barrier may be many tens of Angstroms wide. More generally, current may be conducted between the metal and semiconductor by so-called "thermionic field emission" which is a combination of thermionic emission and tunneling of electrons through the energy barrier.

The present invention seeks to eliminate, or at least sharply reduce, this barrier by inserting an electric dipole layer between the metal and the semiconductor, shifting the relative positions of the band edge and the Fermi energy at the interface. The resulting energies are illustrated in FIG. 1(b). The net result is to remove almost all of the barrier region, except for that remaining in the dipole layer.

How this is accomplished for a silicon-metal interface is most simply understood in terms of "theoretical alchemy", as described in W. A. Harrison, *Elementary Electronic Structure*, World Scientific (Singapore, 1999), revised edition (2004) and in the article *Polar Heterojunction Interfaces*, by W. A. Harrison et al., Phys. Rev. B 18, 4402 (1978). One imagines removing a proton from the nucleus of each silicon atom in the last plane before the metal, converting it to an aluminum nucleus (one element to the left in the Periodic Table) and inserting that proton in the nucleus in the next to last plane of the silicon lattice, converting it to a phosphorous nucleus. This effectively produces a sheet of negative charge in the last plane of atoms before the metal and a sheet of positive charge in the next to last plane and results in a dipole with a large electric field between the two planes of atoms. This field actually polarizes the bonds in this layer, reducing it by a factor of the reciprocal of the dielectric constant (1/12=0.083 for silicon), but still a large field and a large shift in electrical potential results as illustrated in FIG. 5(a). In fact, not only are the bonds within the dipole layer polarized, so too are the bonds in neighboring layers, modifying the effective charges of all atoms in the region, modifying the fields as shown in FIG. 5(b). It however leaves a very similar net shift in electric potential (estimated to be 1.39 eV in the case of (100) planes in silicon, with bond length d=2.35 Å), more than enough to remove the bulk barrier.

We could repeat the theoretical-alchemy process, removing another proton from the Al nucleus, making it a magnesium nucleus, and insert it in the phosphorus nucleus to make it a sulfur nucleus. The same concept applies and this doubles the charge on each plane and doubles the dipole shift. It corresponds to inserting a plane of atoms from column II and a plane of atoms from column VI, rather than III and V. One could even apply it a third time, inserting a NaCl layer, but probably such a deposition would not continue the silicon structure epitaxially as generally in our invention, but would very likely form a neutral NaCl rock-salt plane, without a dipole layer. On the other hand some noble-metal halides do form in the tetrahedral structure of silicon and these would be expected to grow epitaxially, corresponding to a monolayer of a column VII element and a monolayer of a column IB (noble-metal) element and the estimated dipole shift would be three times that of the Al—P bi-layer. Thus our invention includes also dipole shifts from epitaxial layers from columns VI, VII, II, and IB, as well as columns V and III.

The result is not changed if, instead of theoretically converting the last two planes of silicon atoms to phosphorous and aluminum, we instead interpose between the silicon and the metal actual single atomic layers of phosphorous, or any other column V element, and aluminum, or another column III element. Any suitable corresponding bi-layers of group V-group III materials may be used for the purpose of eliminating (or at least significantly reducing) the Schottky barrier and can be chosen for convenience or other considerations, and similarly any element of the columns IB, II, VI, and VII serve as well as the ones mentioned in the preceding paragraph. More specifically, an ordered monolayer of group VI elements sulfur and/or selenium and/or tellurium may be deposited in combination with an ordered monolayer of group II elements zinc and/or cadmium to form an ordered II-VI bi-layer.

Turning now to FIG. 2, one example of a process 10 for forming a very low resistance metal contact to a semiconductor surface is illustrated. In this process, a {100}-oriented surface of the group IV semiconductor (or alloy or compounds of group IV semiconductors and/or carbon), 12, is etched with a crystallographically selective etch to reveal and expose one or multiple {111}-oriented semiconductor crystal facets 14. Then, a monolayer of group V atoms is formed 16 on the {111} facets, followed by deposition 18 of a suitable group III metal to form the contact. Note, the monolayer of group V atoms need not necessarily be a perfect ordered monolayer. That is, the monolayer of group V atoms may have some gaps in coverage or some excess atoms. Stated differently, there may remain, after deposition of the ordered monolayer, some number of unsatisfied dangling bonds of the group IV semiconductor or a number of group V atoms in excess of the number of previous dangling bonds of the group IV semiconductor or some fraction of semiconductor or group V atoms at the surface that are disordered and not in alignment with the semiconductor crystal lattice. Nevertheless, in either instance this will still be considered an ordered monolayer of group V atoms for purposes of the present invention.

In an alternative process to the one described in FIG. 2, the metal atoms in step 18 may be metal atoms other than group III metal atoms. For example, the metal may be an alloy of pure metals, a metal silicide or a metallic compound.

The monolayer of group V atoms may be produced by way of a vapor deposition process or by a chemical reaction. In the case of a vapor deposition process, this may include exposing the semiconductor at an elevated temperature to a vapor flux of group V atoms or a flux of molecules of the group V element. The flux of group V atoms/molecules may be generated by thermally evaporating a source of the group V element. In one embodiment of the invention, the flux is a flux of arsenic molecules of composition $As_4$ and the $As_4$ molecular flux is created by the thermal evaporation of an elemental arsenic source in a Knudsen cell (k-cell) as is known in the practice of molecular beam epitaxy.

The various manufacturing tools that may be used for deposition of the group V and/or group III monolayers include molecular beam epitaxy (MBE), gas source molecular beam epitaxy (GSMBE), metalorganic molecular beam epitaxy (MOMBE), metalorganic chemical vapor deposition (MOCVD), metalorganic vapor phase epitaxy (MOVPE), atomic layer deposition (ALD), atomic layer epitaxy (ALE) and chemical vapor deposition (CVD) tools, including plasma-enhanced CVD (PECVD) or photon or laser-induced CVD.

Another vapor deposition process that may be used in accordance with embodiments of the present invention involves the group V element atoms being deposited on the semiconductor surface by decomposition of a vapor phase compound of the group V element, for example a hydride of the group V element. Suitable group V hydride gases include ammonia, $NH_3$, for nitrogen atom deposition; phosphine, $PH_3$, for phosphorus; arsine, $AsH_3$, for arsenic and stibine, $SbH_3$, for the deposition of an antimony atomic layer. Alternatively the vapor phase compound of the desired group V element could be a metalorganic compound, examples of such being an alkyl arsine such as tertiary butyl arsine for the deposition of an arsenic monolayer or an alkyl stibine such as triethylantimony (triethylstibine) for the deposition of an antimony monolayer.

In the case of a process carried out under ultra-high vacuum conditions, prior to being exposed to the group V atom or compound vapor flux, the silicon with the {111}-oriented surface may be cleaned in situ and heated to a sufficiently high temperature to obtain a 7×7 reconstruction of the {111} silicon surface. FIGS. 3(a) (perspective view), 3(b) (plan view of primitive unit cell) and 3(c) (side view of primitive unit cell) provide views of such a 7×7 surface 20. Atoms 22 represent atoms in the underlying (1×1) bulk silicon material. Atoms 24 represent so-called rest atoms (atoms one layer below the adatoms). Atoms 26 represent dimers (paired surface silicon atoms). Atoms 28 represent the adatoms (silicon atoms laying on the crystal surface). Corner holes in the structure are shown at 30.

Then, the silicon is maintained at a temperature in the range of approximately 20° C. to 750° C. (inclusive) during exposure to the group V atom vapor or the group V compound molecular vapor. The silicon surface may be exposed to the group V atom or compound molecular vapor flux for less than one second or several seconds or even several minutes. With the silicon held at a suitable temperature, an ordered monolayer of the group V atom is formed and, after so forming, the monolayer resists the deposition of additional group V atoms or deposition of other atoms such as hydrogen or oxygen or carbon atoms. Alternatively the semiconductor temperature may be varied during exposure to the group V atom vapor or the group V molecular compound vapor, starting at a high temperature in the range 600 C to 800° C. and reducing to a lower temperature in the range 500 C to 20° C.

Figure 4:
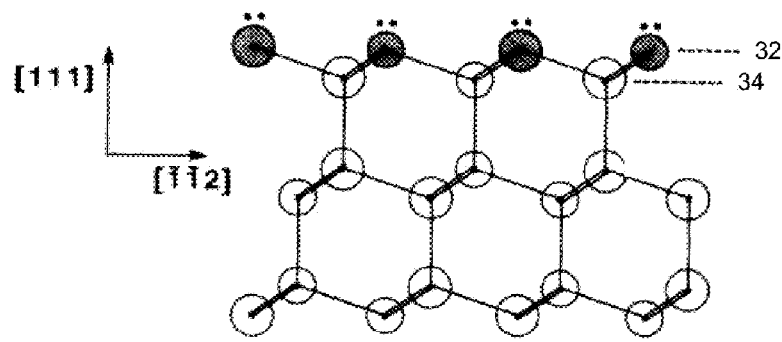
FIG. 4 illustrates an example of group V atoms bonded directly with exposed silicon surface atoms to form a fully coordinated lattice termination with no dangling bonds.

The group V atoms 32 (e.g., As, Sb or P) bond directly with the exposed silicon surface atoms 34 to form a fully coordinated lattice termination with, to the greatest extent possible, no dangling bonds, as shown in FIG. 4, which is a side view of the resulting structure. Three of the five valence electrons in each group V atom form bonds with silicon atoms at the surface of the group IV semiconductor and the remaining two valence electrons form a "lone-pair" orbital as shown in the illustration.

Similar processes may be applied to obtain monolayers of group V atoms on silicon surfaces other than the {111} orientation, such as a {100} orientated silicon surface. Similar processes may also be applied to obtain monolayers of group V atoms on group IV semiconductor surfaces other than silicon, such semiconductors including germanium, silicon germanium, silicon carbon, germanium tin or silicon germanium carbon. Moreover similar processes may also be applied to obtain monolayers of group VI atoms on group IV semiconductor surfaces.

The exposure of the surface of a heated semiconductor to the group V atom flux or compound molecular flux may be done in an ultra-high vacuum (UHV) chamber, in a vacuum chamber or in a reduced pressure chamber. If the chamber in which the process occurs is not a UHV chamber, a background or carrier gas may be present during the exposure. In one embodiment, arsine, $AsH_3$ is delivered in dilute form in a gas mixture consisting primarily of hydrogen ($H_2$) or nitrogen ($N_2$). In semiconductor manufacturing, arsine is typically diluted at a concentration of a few percent or even as low as 100 parts per million or so in ultra pure hydrogen or nitrogen. The arsine, whether it be pure arsine or a dilute mixture of one or a few percent arsine in hydrogen or nitrogen, decomposes at the heated semiconductor surface, liberating free arsenic atoms that bond directly with the exposed silicon surface to form a fully coordinated lattice termination with no, or at least very few, dangling bonds.

A preferred process for the deposition of a monolayer of arsenic on silicon from a hydride precursor gas ($AsH_3$) starts by heating the silicon surface in a hydrogen ambient to a temperature sufficient to reduce any surface oxide then continues by heating the silicon surface to a temperature in the range 650° C. to 750° C. (most preferably between 675° C. and 725° C.) while exposing the surface to $AsH_3$ vapor for a period of between 10 seconds to 30 minutes (most preferably between 20 seconds and 2 minutes). Such a process may be carried out in a CVD system or an ALD system and an ordered monolayer of arsenic atoms is formed. After so forming, the monolayer resists the deposition of additional group V atoms or deposition of other atoms such as hydrogen or oxygen or carbon atoms. Alternatively the semiconductor temperature may be varied during exposure to the $AsH_3$ vapor, starting at a high temperature in the range 650° C. to 750° C. and reducing to a lower temperature in the range 500° C. to 20° C.

As indicated above, it is not strictly necessary that the group V atoms form a perfect monolayer. A metal could be deposited on top of this group V monolayer, or more silicon and then the metal. Thus the monolayer of charge may exist at the interfacial layer (as described above) or at the second, third or fourth planes from the semiconductor-metal interface if one, two or three atomic layers of silicon respectively are deposited after the group V monolayer and before the metal. An advantage of having one or several atomic layers of silicon atoms between and therefore separating the monolayer of charged group V atoms (ions) and the metal atoms is the increased magnitude of the charge dipole so created between the layers and hence the greater reduction of the Schottky barrier for electrons at the metal-semiconductor junction. On the other hand, a disadvantage of having one or several atomic layers of silicon atoms separating the monolayer of charged group V atoms (ions) and the metal atoms is the larger spatial extent of the dipole region which is deleterious to charge conduction through the barrier. For applications where a large Schottky barrier to a p-type semiconductor is desired only advantages are anticipated to result from including silicon atom layers between the group V atoms and metal atoms.

Figure 5:
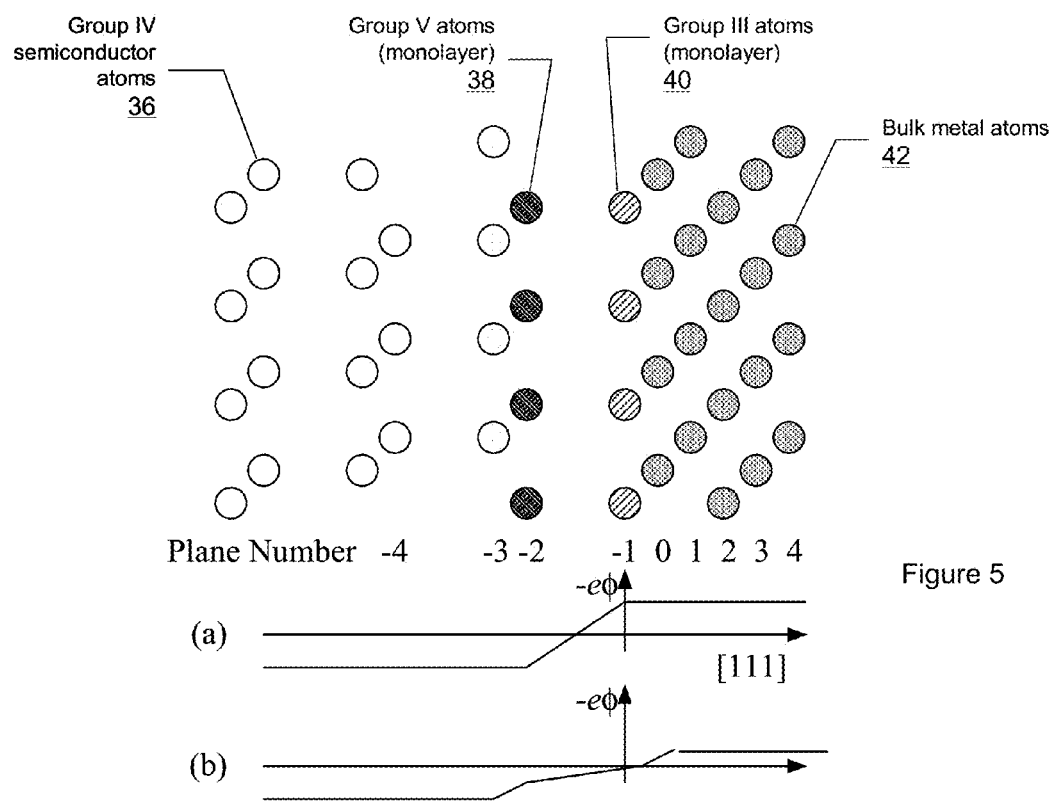
FIG. 5 illustrates a bi-layer (two monolayers) interposed on a (111) surface of an n-type semiconductor, producing a contact by the process illustrated in FIG. 2 in accordance with embodiments of the present invention.

After forming the monolayer of coordinated group V atoms 38 on the surface of a {111}-oriented group IV semiconductor 36, one monolayer of a group III metal atoms 40 is deposited in the embodiment illustrated in FIG. 5, followed by the deposition of the metal contact (bulk metal atoms 42), providing the low barrier, low resistance metal contact, In this embodiment of the invention, the one layer of metal atoms 40 is a layer of group III metal atoms that may include aluminum, gallium or indium or a mixture of these group III metal atoms. In other embodiments of the invention, metals or alloys of metals other than or in combination with a group III metal may be used. This monolayer of group III metal atoms is optional and need not necessarily be present in all junctions formed in accordance with the present invention (a balancing negative charge (described further below) would be an image charge formed in the bulk metal).

Where present, the metal atoms in the one layer of metal atoms are preferably coordinated with the monolayer of group V atoms already present on the semiconductor surface so as to form an ordered layer of metal atoms. Embodiments are possible, however, wherein the first layer of metal atoms is not strongly coordinated by chemical bonding to the underlying ordered layer of group V atoms. The process then continues to deposit further metal atoms 42, the further atoms being of the same metallic element as the first layer of metal atoms or atoms of a metal element different from the first layer of metal atoms. FIG. 5 would illustrate the resulting structure if one makes atoms 40 and 42 the same element.

In FIG. 5, a single bi-layer that includes a monolayer of group V atoms 38 and a monolayer of group III atoms 40 disposed between the semiconductor atoms 36 and bulk metal 42 is represented. The two plots, (a) and (b), in the illustration represent the potentials at various locations across the junction, with plot (a) showing the first step in the theoretical alchemy without the polarization of neighboring bonds and plot (b) taking such relaxation into account. Plot (b) is somewhat exaggerated to highlight the nature of the potentials experienced across the junction.

The monolayer of group III metal atoms may be produced by a vapor deposition process or by a chemical reaction. For example, in the case of a vapor deposition process, the one layer of metal atoms may be formed on the semiconductor surface by exposure of the surface to an atomic vapor flux of the group III metal element or to a vapor flux of a compound of the metallic element. Exposure may be for a duration of less than one second or a duration of several seconds or even several minutes.

The vapor deposition process may involve exposure of the semiconductor with the monolayer of Group V atoms to a vapor flux of metal atoms or a flux of molecules of the metallic element. The flux of metal atoms/molecules may be generated by thermally evaporating a source of the metal. In one embodiment of the invention, the flux is a flux of aluminum atoms created by the thermal evaporation of an elemental aluminum source in a Knudsen cell (k-cell) as is known in the practice of molecular beam epitaxy or evaporation of an elemental aluminum source by heating with an electron beam. The semiconductor may be heated during the deposition of the metal atoms. In an alternative vapor deposition process, the metal atoms may be deposited on the semiconductor surface by decomposition of a vapor phase chemical compound of the metal, for example a metalorganic compound. Such a process may be classified most generally as a chemical vapor deposition process. Suitable metalorganic compounds of aluminum include tri-methyl aluminum. Deposition of a monolayer of metal atoms from decomposition of a chemical vapor source is known more specifically as atomic layer epitaxy if the metal atoms enter into an epitaxial alignment to the semiconductor crystal lattice or atomic layer deposition if the metal atoms do not. In another alternative vapor deposition process, the metal atoms may possibly be deposited by sputtering of the metal atoms from a solid source in what is known as a physical vapor deposition (PVD) process.

After depositing the one layer of metal atoms, processing may continue by depositing additional layers of metal atoms (which may be the same metal as the monolayer of group III atoms or a different metal). The further additional layers of metal atoms may be of elemental composition and thickness in accordance with the requirements of the specific application of the resulting metal-semiconductor contact. For example for contacts to nanometer-scale FETs, the additional layers of metal atoms may be layers of a barrier metal such as tantalum nitride, titanium nitride or ruthenium. In this context and in the common terminology of the microelectronics industry, a barrier metal is a thin metal layer usually deposited by a conformal deposition technique such as atomic layer deposition (ALD), plasma enhanced ALD or chemical vapor deposition (CVD) that provides a barrier to the diffusion of a copper metallization layer into the semiconductor. Alternatively the barrier metal may be deposited in an electrochemical deposition process or by reactive physical vapor deposition (PVD) wherein the metal is sputtered from a solid source or target. In alternative embodiments the additional layers of metal atoms may constitute a metal silicide such as a nickel silicide of composition Ni2Si, NiSi or NiSi2 or a platinum silicide or nickel-platinum silicide or cobalt silicide wherein the metal silicide is directly adjacent to the group V monolayer or to the group V—group III bi-layer.

In addition to depositing a monolayer of a group V material such as arsenic, phosphorus, etc., on a silicon surface, as previously discussed, it may be advantageous to deposit some of the group V material at a sufficiently high temperature that some of the atoms enter the silicon itself. Alternately, the silicon surface can be prepared in other known ways so that group V atoms are present near the silicon surface. After this, the group V material is deposited in an appropriate manner for the monolayer to form on the silicon surface. The objective of this is that the additional group V atoms in the silicon advantageously form additional dipoles with image charges in the metal deposited on the monolayer of group V material, favorably increasing the overall dipole effect.

Figure 6A:
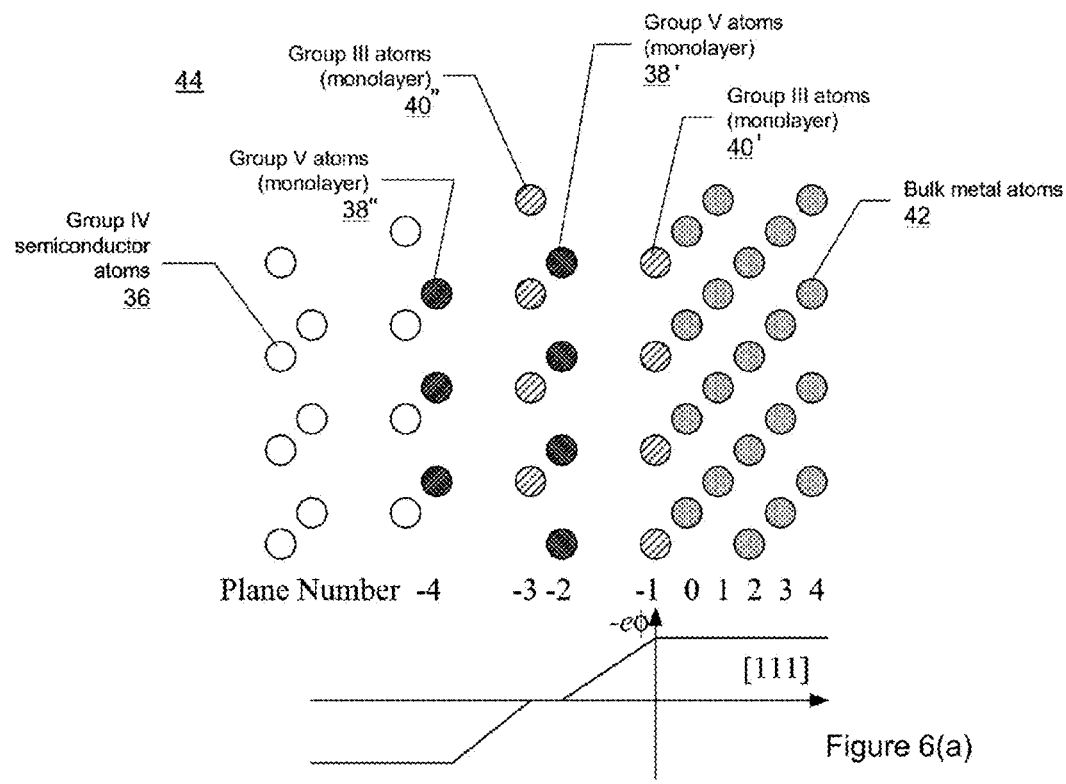
FIGS. 6(a) and 6(b) illustrate double bi-layers on (111) interfaces for n-type semiconductors with fields across long or short interplanar separations, respectively.
Figure 6B:
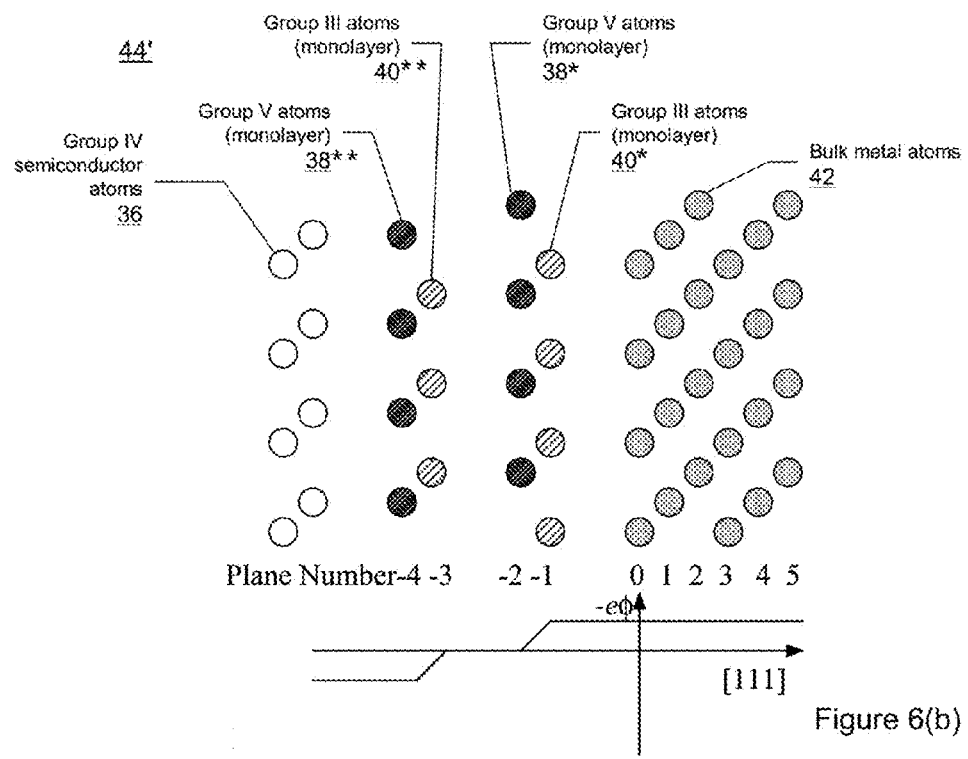

FIGS. 6(a) and 6(b) are further examples of metal-semiconductor contacts configured in accordance with embodiments of the present invention. In FIG. 6(a), contact 44 is similar to the one illustrated in FIG. 5, but includes an additional bi-layer of a group V element and a group III metal. The electrical dipole is created across the long interlayer separation (i.e., the relatively long distance between the constituent monolayers 38 and 40 of the bi-layer). In FIG. 6(b), contact 44' has an electrical dipole across the short interlayer separation (i.e., the relatively short distance between the constituent monolayers 38 and 40 of the bi-layer).

Figure 7:
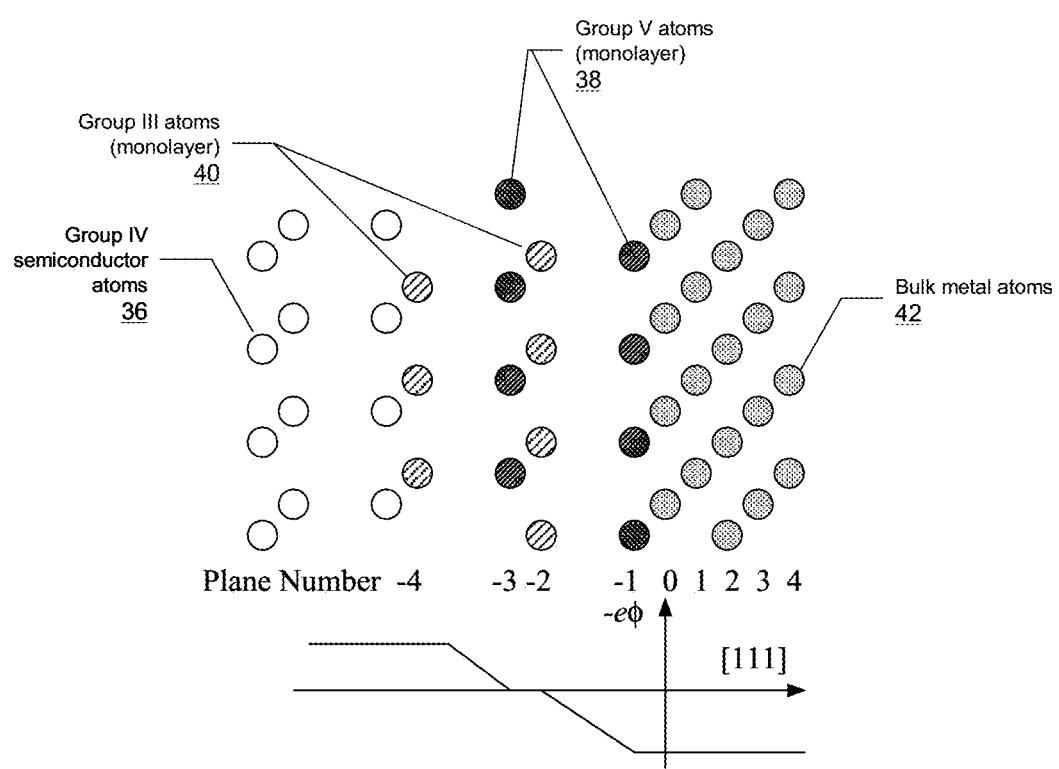
FIG. 7 illustrates double bi-layers, as in FIG. 6, but for p-type semiconductors, providing an extremely low resistance to the electrical conduction of holes through the contact, in accordance with further embodiments of the present invention.

As shown in FIG. 7, to obtain a metal-semiconductor contact with extremely low barrier height to holes and an extremely low resistance to the electrical conduction of holes through the contact, the single ordered layer of atoms is a single ordered layer of metal atoms 40 and includes a single atomic layer of group V atoms 38 chemically bonded to the monolayer of metal atoms and separated from the semiconductor 36 surface atoms by the monolayer of metal atoms 40. In some embodiments, the single atomic layer of metal atoms is a monolayer of group III metal atoms that may be aluminum atoms, gallium atoms or indium atoms or a mixture of these group III metal atoms. In some cases the monolayer of group III metal atoms is a layer of indium atoms ordered in epitaxial (or substantially epitaxial) alignment with the germanium or silicon or group IV semiconductor alloy crystal lattice and an adjacent monolayer of group V atoms is chemically bound to the monolayer of metal atoms. The group V atoms may be nitrogen atoms, phosphorus atoms, arsenic atoms or antimony atoms or a mixture of these group V atoms. In some cases the monolayer of group V atoms is a layer of arsenic atoms ordered in alignment with and chemically bonded to the group III metal atoms that form a single atomic layer in crystallographic alignment with and chemically bonded to the surface atoms of the germanium or silicon or group IV semiconductor alloy crystal lattice. In the illustration, two bi-layers between the semiconductor and the bulk metal are shown, but embodiments that include a single bi-layer are also contemplated within the scope of the present invention.

In some embodiments where it is required to form an extremely low resistance contact to a p-type semiconductor or to provide an extremely high conductance source and/or drain in a p-channel field effect transistor, the contacted surface is a {111}-oriented semiconductor surface. In other embodiments the contacted surface of the semiconductor is a {100}-oriented surface.

Figure 8:
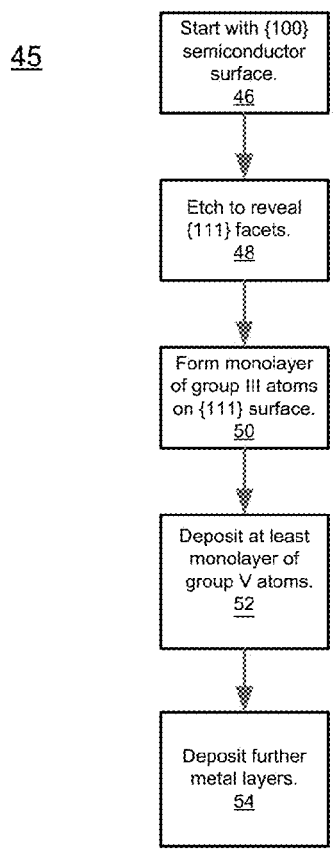
FIG. 8 illustrates a process for creating the contact shown in FIG. 7 in accordance with embodiments of the present invention.

FIG. 8 illustrates a process 45 for creating the contact shown in FIG. 7. Beginning with a {100}-oriented semiconductor surface 46, the (100) surface is etched with a crystallographically selective etch to reveal and expose one or multiple {111} oriented semiconductor crystal facets 48. A monolayer of group III metal atoms is formed on the {111} facets 50, followed by deposition of a monolayer of group V atoms 52. Obviously, one can start the process directly from a {111} surface that may already be present as a result of an alternate device geometry or other considerations.

After depositing the monolayer of group V atoms, the process continues by depositing further multiple layers of metal 54. The further additional layers of metal atoms may be of elemental composition and thickness in accordance with the requirements of the specific application of the resulting metal-semiconductor contact, as previously described for the formation of contacts to n-type semiconductors with extremely low resistance to electron conduction.

The monolayer of group III metal atoms may be produced by a vapor deposition process or by a chemical reaction. In the case of a vapor deposition process, the semiconductor is exposed to a vapor flux of group III metal atoms or a flux of molecules of a compound of the group III metal element. The flux of group III atoms/molecules may be generated by thermally evaporating a source of the group III element. In one embodiment of the invention, the flux is a flux of indium atoms created by the thermal evaporation of an elemental indium source in a Knudsen cell (k-cell) as is known in the practice of molecular beam epitaxy. In an alternative vapor deposition process, the group III element atoms are deposited on the semiconductor surface by decomposition of a vapor phase compound of the group III element, for example a metalorganic compound of the group III element. Decomposition of a vapor phase precursor compound of the group III metal may be achieved by heating of the semiconductor surface. Where it is preferred not to heat the semiconductor surface to very high temperatures, decomposition may be achieved by plasma in a plasma-enhanced CVD (PECVD) or plasma-enhanced ALD (PEALD) type of tool and process. Alternatively decomposition of the metal precursor may be achieved by a photon-induced process.

The semiconductor with the {111}-oriented surface may be cleaned in situ before it is exposed to the group III atom or group III molecular compound vapor flux, for example by heating it to a sufficiently high temperature under ultra-high vacuum conditions to obtain for the case of silicon a 7×7 reconstruction of the {111} silicon surface. Then the semiconductor is maintained at a temperature in the range 20° C. to 750° C. inclusive during exposure to the group III atom vapor or the group III molecular compound vapor. Alternatively the semiconductor temperature may be varied during exposure to the group III atom vapor or the group III molecular compound vapor, starting at a high temperature in the range 600 C to 800° C. and reducing to a lower temperature in the range 500 C to 20° C.

The semiconductor surface may be exposed to the group III atom or compound vapor flux for less than one second or several seconds or even several minutes. The group III atoms bond directly with the exposed group IV semiconductor surface to form a monolayer of group III atoms, the group III atoms being to the greatest extent possible in crystallographic alignment with the semiconductor lattice.

The exposure of the surface of the semiconductor to the group III atom flux or molecular compound vapor flux may be done in a UHV chamber, in a vacuum chamber or in a reduced pressure chamber. If the chamber in which the process occurs is not a UHV chamber, a background or carrier gas may be present during the exposure. In one embodiment, a metalorganic compound precursor such as trimethyl indium is delivered in dilute form in a gas mixture consisting primarily of a carrier gas such as hydrogen or nitrogen and decomposes at the heated semiconductor surface, liberating indium atoms that bond directly with the exposed silicon. In another embodiment, the metalorganic compound is trimethyl aluminum or trimethyl gallium, which reacts at the heated semiconductor surface to form a monolayer of aluminum or gallium atoms, respectively.

After forming the monolayer of coordinated group III metal atoms on the surface of a {111}-oriented group IV semiconductor, formation of the low barrier, low resistance metal contact continues by deposition of one layer of group V atoms. The group V atoms in the one layer of group V atoms are preferably coordinated with the monolayer of group III metal atoms already present on the semiconductor surface so as to form an ordered layer of group V atoms. The process then continues to deposit further metal atoms, the further atoms being of the same metallic element as the first layer of metal atoms or atoms of a metal element different from the first layer of metal atoms.

In another embodiment of the invention, after forming the monolayer of coordinated group III metal atoms on the surface of a {100} or {111}-oriented group IV semiconductor, formation of the low barrier, low resistance metal contact continues by deposition of a metal over the monolayer. The metal is not necessarily a group V metal. The metal may be one having desirable properties such as structural or chemical stability to ensure reliability of the electrical contact or device so formed. Examples of stable metals for contacts include platinum (Pt), tungsten (W) and the previously described "barrier metals" TaN, TiN and Ru. A metal could be deposited directly on top of the group III monolayer, such that the group III monolayer is exactly at the interface between the metal and the semiconductor or alternatively the group III monolayer may be separated from the metal by one or two monolayers of the group IV semiconductor. Thus the monolayer of charge associated with the group III monolayer may exist at the interfacial layer or at the second or third planes from the semiconductor-metal interface if one or two atomic layers of group IV semiconductor respectively are intermediate between the group III monolayer and the metal. An advantage of having one or several atomic layers of silicon atoms between and therefore separating the monolayer of charged group III atoms (ions) and the metal atoms is the increased magnitude of the charge dipole so created between the layers and hence the greater reduction of the Schottky barrier at a metal—p-type semiconductor junction or at a metal to p-channel source/drain junction of a MOSFET.

Another embodiment of the invention forms a metal semiconductor contact with a monolayer of group V or group III atoms at the metal-semiconductor interface where the group V (for example arsenic) monolayer or group III (for example boron) monolayer is formed by segregation of group V or group III atoms out of a layer of material in contact with the semiconductor surface. The layer of material may be deposited on the semiconductor surface, for example by CVD or PVD. The group V atoms may be introduced into the layer of material by including them as a dopant in the CVD or PVD deposition process or by ion implantation. Alternatively the layer of material may be formed by reaction of another element or elements with the semiconductor surface in which case the group V or group III atoms may be implanted either before or after the material is formed by chemical reaction. For example the layer may be silicon oxide or silicon nitride formed by thermal oxidation of a silicon surface and the group V or group III atoms may be introduced into the silicon oxide or nitride layer by ion implantation. In another embodiment the layer may be a deposited thin film of doped silicon oxide containing a high concentration of a group V element such as phosphorus or a group III element such as boron. The former is generally known as a "phosphosilicate glass" ("PSG") and the latter as a "borosilicate glass" ("BSG") and methods for deposition of these doped silicate glasses (such as CVD) are well known and widely practiced in the microelectronics industry. Alternatively the layer of material may be a metal silicide formed by reaction of a metal with a silicon surface and the group V or group III atoms may be introduced into the metal silicide layer by ion implantation.

After introducing a concentration of group V or group III atoms in the layer of material in contact with the semiconductor surface, the whole layer structure is annealed at a sufficiently high temperature to cause the group V or group III atoms to segregate to the interface form an ordered monolayer of group V or group III atoms at the interface with the group V or group III atoms bonded in epitaxial coordination with the top layer of semiconductor atoms. In a case where the layer of material is a doped silicon oxide (e.g. PSG or BSG) or silicon nitride and the semiconductor is silicon, after the anneal cycle has caused segregation of some group V or group III element to the silicon—silicon oxide (or nitride) interface, the silicon oxide (or nitride) is subsequently removed by selective wet chemical etching, leaving behind a coordinated monolayer of the group V or group III atoms at the semiconductor surface, and a metal is deposited to form a metal contact to the semiconductor. In a case where the layer of material is a metal silicide and the semiconductor is silicon, after the thermal cycle has caused the interfacial segregation of the group V or group III element to form an interfacial ordered monolayer, the metal silicide may be removed or may be retained in place to function as the metal contact itself.

Figure 9:
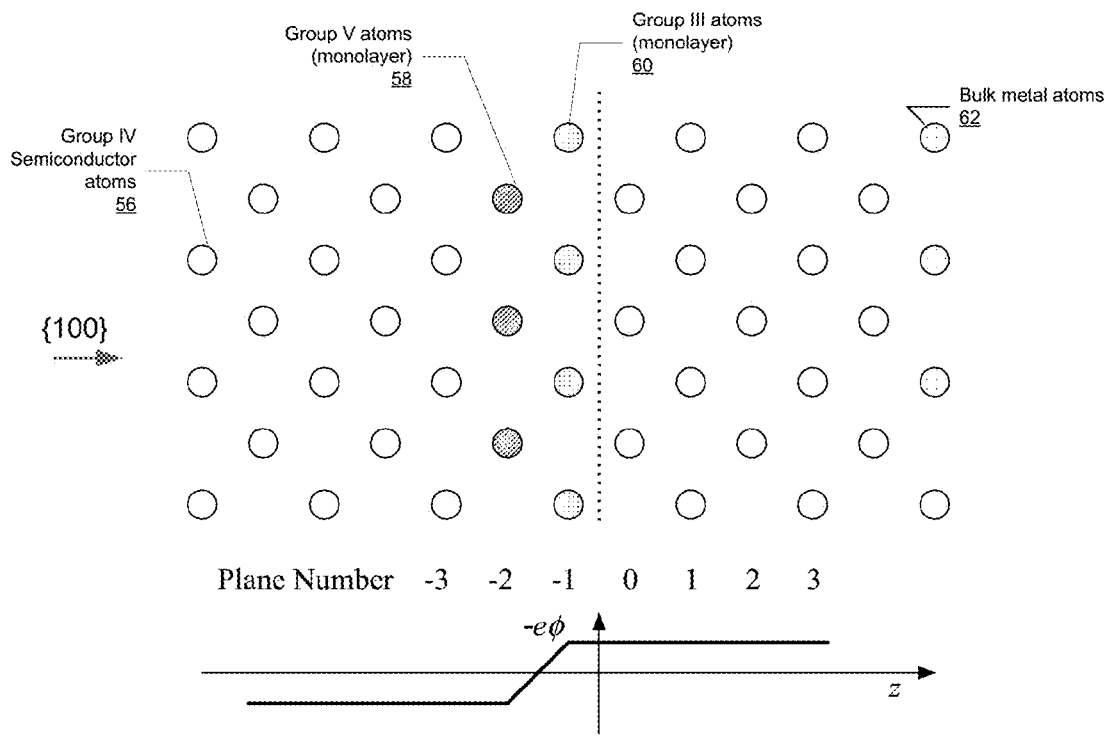
FIG. 9 illustrates one bi-layer (two monolayers), as in FIG. 5, but for a {100} semiconductor surface, rather than a {111} surface.

Still further embodiments of the present invention involve the use of a {100}-oriented semiconductor surface. FIG. 9 illustrates an example of a contact that includes such a surface, this contact including a monolayer of group V atoms that has been deposited on the group IV semiconductor {100} surface using any of the above-discussed techniques. A monolayer of group III metal atoms is then deposited on the group V atoms, followed by deposition of further metal layers. These further metal atoms may be of the same metallic element as the first layer of metal atoms or atoms of a metal element different from the first layer of metal atoms. The metal-semiconductor contact shown in FIG. 9 provides extremely low barrier height to electrons and an extremely low resistance to the electrical conduction of electrons through the contact. If the contact is intended to provide extremely low barrier height to holes and an extremely low resistance to the electrical conduction of holes through the contact, the positions of the group V atoms and group III atoms in the bi-layer would be reversed with respect to one another.

Experimental Schottky diodes have been fabricated to illustrate the effect of an arsenic interfacial monolayer on an example aluminum-silicon Schottky barrier. The example experiments do not represent typical process conditions nor do they necessarily represent optimal process conditions. The illustrative experiments were done on {111}-oriented silicon wafers, doped p-type with a boron concentration of approximately $1\times10^{17}$ atoms/cm$^3$. A first set of experimental Schottky diodes was fabricated under ultra-high vacuum conditions and a second set under low pressure chemical vapor deposition conditions in a hydrogen atmosphere.

Figure 10:
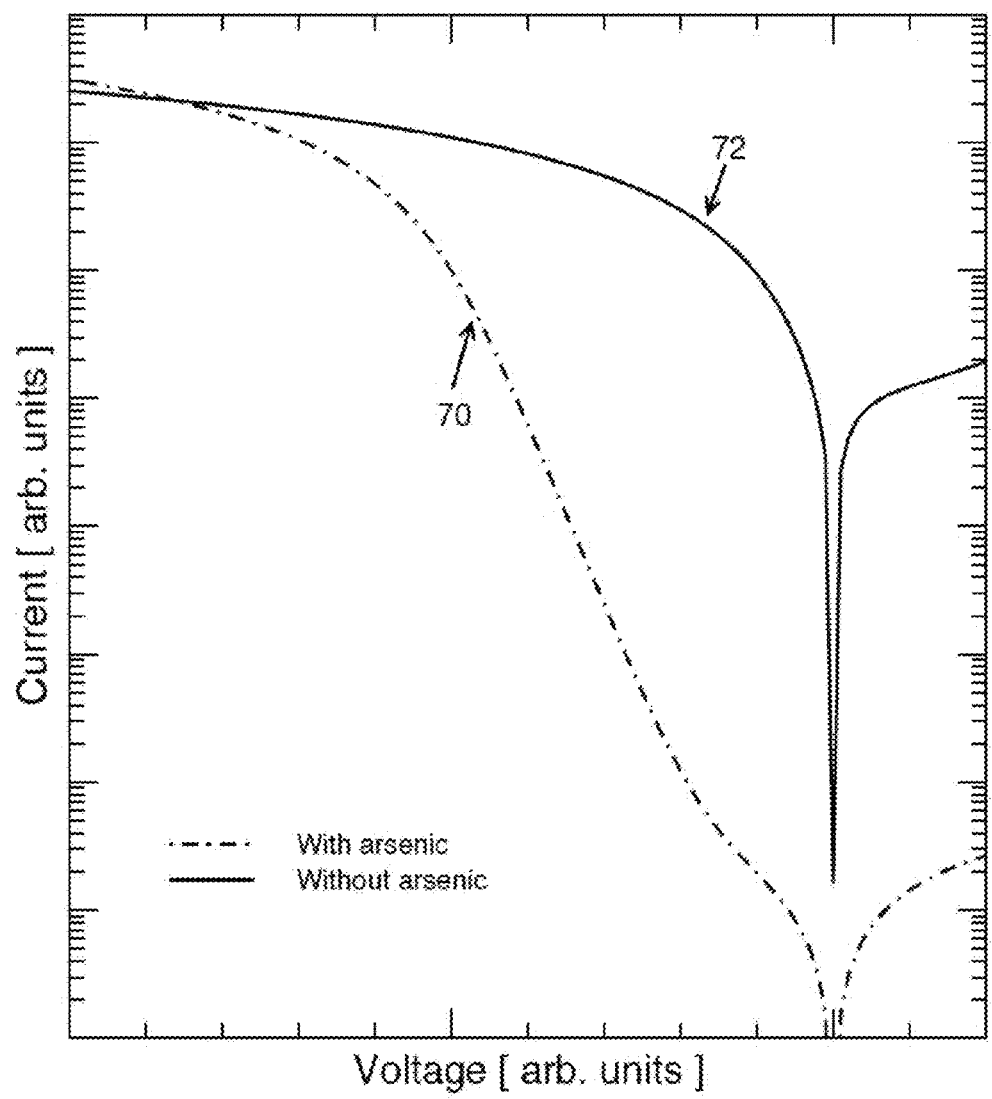
FIGS. 10 and 11 illustrate experimental Schottky diode current—voltage characteristics obtained from aluminum—{111} oriented p-type silicon contacts and compares measured data from contacts with an arsenic atomic monolayer at the interface with data from contacts with no arsenic interfacial layer.

The first set of diodes was processed as follows: After heating the silicon to a high temperature above 800° C. in ultra high vacuum to clean and reconstruct the {111} Si surface to 7×7, the temperature was reduced from 800° C. to 700° C. and then the silicon surface was exposed to a flux of arsenic molecules of type As$_2$ for ten minutes before the As$_2$ flux was terminated. Rutherford back scattering analysis confirmed that an areal density of arsenic equal to $7.30\times10^{14}$ atoms/cm$^2$ resulted from this exposure, a value that is close to the known areal density $7.83\times10^{14}$ atoms/cm$^2$ of surface atoms on a 1×1 reconstructed {111} silicon surface. As such it may be reasonably concluded that approximately a single monolayer of arsenic atoms had been deposited. After cooling to room temperature, a layer of pure aluminum was deposited in the same ultra high vacuum system and subsequently patterned to provide simple diode structures that could be measured electrically. For comparison purposes, a similar wafer was processed through a similar sequence of steps except without any deliberate exposure of the silicon surface to arsenic. FIG. 10 shows representative measured current versus voltage characteristics of these experimental diodes, taking equally sized diodes from each wafer (with and without the arsenic). Diodes on wafers without arsenic at the interface consistently exhibit a relatively small Schottky barrier height to the p-type silicon as indicated by the measured curve 72 in FIG. 10. From curve 72, a barrier height may be extracted by fitting a standard diode equation (thermionic emission model) to the measured data. The extracted barrier height for diodes without arsenic exposure is 0.40 eV (with an experimental error of approximately 0.03 eV), which is consistent with published values of barrier height for intimate aluminum contacts on p-type silicon. Diodes on wafers that had the silicon interface exposed to arsenic so as to form a monolayer consistently exhibit a larger Schottky barrier height to the p-type silicon as indicated by data curve 70 in FIG. 10. The larger barrier height to p-type silicon is indicative of a smaller barrier height to n-type silicon according to the general rule that the sum of magnitudes of the n-type and p-type barrier heights is very close to the silicon band gap. Thus it is demonstrated experimentally that a monolayer of arsenic introduced at the interface between aluminum and a {111} oriented silicon surface does provide a larger Schottky barrier to p-type silicon consistent with a reduced electron barrier between the aluminum Fermi level and the conduction band of the silicon (i.e. consistent with a reduced Schottky barrier height to n-type silicon).

Figure 11:
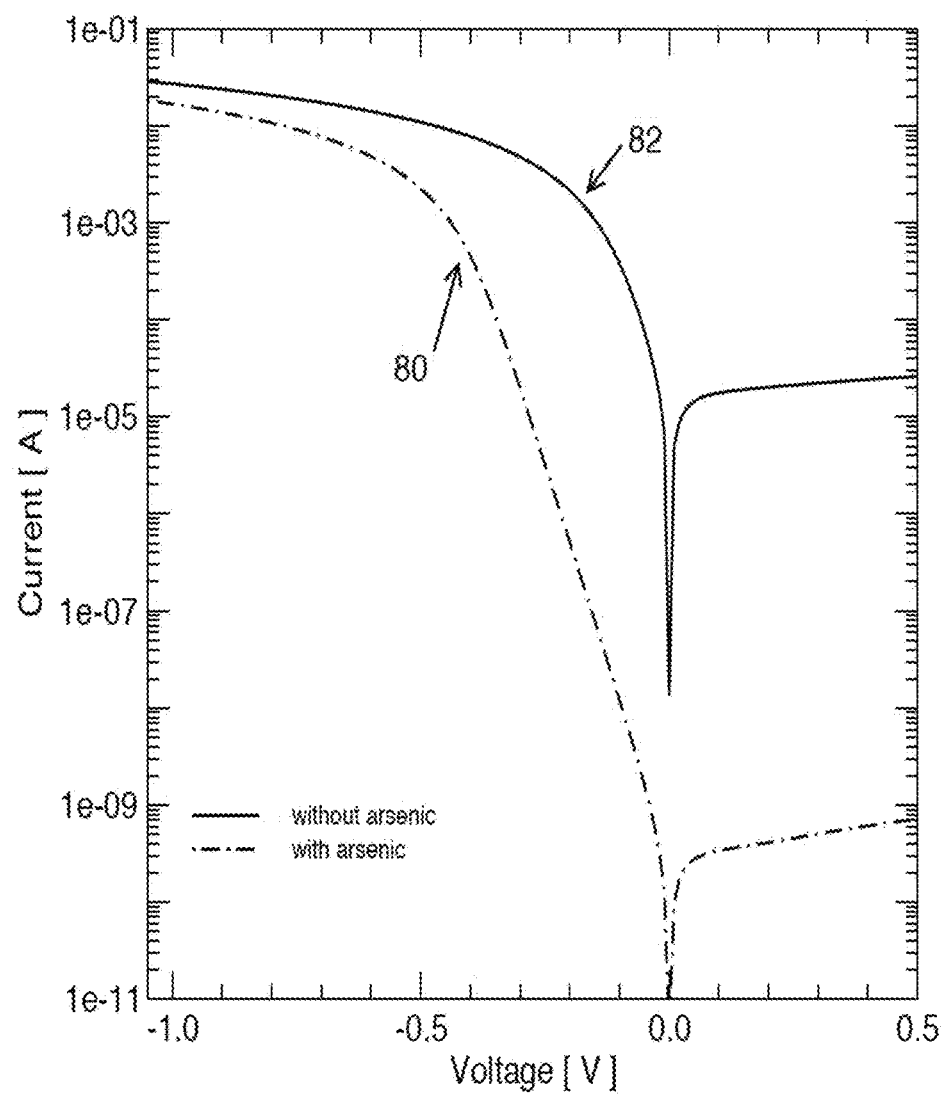

The second set of diodes was processed as follows: After heating the silicon to 900° C. in a flow of hydrogen gas to clean the {111} Si surface, the temperature was reduced from 900° C. to 700° C. and then the silicon surface was exposed to a flux of arsine (AsH$_3$) molecules for ten minutes with the temperature held at 700° C. before the AsH$_3$ flow was terminated. The arsine was heavily diluted in hydrogen (H$_2$) at a concentration of approximately 2 parts per million with a total gas flow of 20.4 liters per minute. Rutherford back scattering analysis confirmed that an areal density of arsenic equal to $7.8 \times 10^{14}$ atoms/cm$^2$ resulted from this exposure, a value that is close to the known areal density $7.83 \times 10^{14}$ atoms/cm$^2$ of surface atoms on a 1×1 reconstructed {111} silicon surface. As such it may be reasonably concluded that approximately a single monolayer of arsenic atoms had been deposited. After cooling to room temperature, a layer of pure aluminum was deposited by electron beam evaporation in a separate ultra high vacuum system and subsequently patterned to provide simple diode structures that could be measured electrically. For comparison purposes, a similar wafer was processed through a similar sequence of steps except without any deliberate exposure of the silicon surface to arsenic. FIG. 11 shows representative measured current versus voltage characteristics of these experimental diodes (with and without the arsenic). Diodes on wafers without arsenic at the interface consistently exhibit a relatively small Schottky barrier height to the p-type silicon as indicated by the measured curve 82 in FIG. 11. From curve 82, a barrier height may be extracted by fitting a standard diode equation (thermionic emission model) to the measured data. The extracted barrier height for diodes without arsenic exposure is 0.42 eV (with an experimental error of approximately 0.03 eV), which is consistent with published values of barrier height for intimate aluminum contacts on p-type silicon. Diodes on wafers that had the silicon interface exposed to arsenic so as to form a monolayer consistently exhibit a larger Schottky barrier height to the p-type silicon as indicated by data curve 80 in FIG. 11. The larger barrier height to p-type silicon is indicative of a smaller barrier height to n-type silicon according to the general rule that the sum of magnitudes of the n-type and p-type barrier heights is very close to the silicon band gap. Thus it is demonstrated experimentally that a monolayer of arsenic introduced at the interface between aluminum and a {111}-oriented silicon surface does provide a larger Schottky barrier to p-type silicon consistent with a reduced electron barrier between the aluminum Fermi level and the conduction band of the silicon (i.e. consistent with a reduced Schottky barrier height to n-type silicon).

Thus, techniques for reducing the specific contact resistance of a metal-semiconductor junction by interposing a monolayer of group V or group III atoms, or multiple monolayers of group V and group III atoms at the interface between the metal and the semiconductor have been described.

What is claimed is:

1. An electrical contact, consisting of a metal and a group IV semiconductor separated by a monolayer of group III atoms at an interface between the metal and the group IV semiconductor, the atoms of the monolayer of group III being in epitaxial alignment with a lattice structure of the group IV semiconductor.

2. The contact of claim 1, wherein the metal comprises atoms of a same metallic element that is the metallic element of the group III metal atoms.

3. The contact of claim 1, wherein the metal comprises atoms of a different metallic element than that of the monolayer of group III metal atoms.

4. The contact of claim 3, wherein the metal comprises ruthenium, tantalum nitride or titanium nitride.

5. The contact of claim 1, wherein the group IV semiconductor comprises any of germanium, silicon, an alloy of silicon and germanium, an alloy of germanium and tin, an alloy of silicon with carbon, a compound of silicon and carbon, an alloy of germanium with carbon, a compound of germanium and carbon, silicon germanium carbon.

6. The contact of claim 1, wherein the group III atoms comprise any one or more of aluminum, gallium, indium, or alloys of aluminum, gallium and/or indium.

7. The contact of claim 1, wherein a surface of the group IV semiconductor at the interface is a {111}-oriented surface, a {110}-oriented surface, or a {100}-oriented surface.

* * * * *